United States Patent
Paredis et al.

(10) Patent No.: US 11,549,963 B2
(45) Date of Patent: Jan. 10, 2023

(54) METHOD AND APPARATUS FOR ALIGNING A PROBE FOR SCANNING PROBE MICROSCOPY TO THE TIP OF A POINTED SAMPLE

(71) Applicants: IMEC VZW, Leuven (BE); Katholieke Universiteit Leuven, KU LEUVEN R&D, Leuven (BE)

(72) Inventors: Kristof Paredis, Oud-Heverlee (BE); Jonathan Op de Beeck, Zonhoven (BE); Claudia Fleischmann, Bertem (BE); Wilfried Vandervorst, Mechelen (BE)

(73) Assignees: IMEC VZW, Leuven (BE); Katholieke Universiteit Leuven, KU Leuven R&D, Leuven (BE)

( * ) Notice: Subject to any disclaimer, the term of this patent is extended or adjusted under 35 U.S.C. 154(b) by 57 days.

(21) Appl. No.: 17/414,207

(22) PCT Filed: Sep. 23, 2019

(86) PCT No.: PCT/EP2019/075506
§ 371 (c)(1),
(2) Date: Jun. 15, 2021

(87) PCT Pub. No.: WO2020/126136
PCT Pub. Date: Jun. 25, 2020

(65) Prior Publication Data
US 2022/0065895 A1  Mar. 3, 2022

(30) Foreign Application Priority Data
Dec. 20, 2018  (EP) .................................. 18214398

(51) Int. Cl.
*G01Q 10/06* (2010.01)
*G01Q 20/02* (2010.01)
*G01Q 60/54* (2010.01)

(52) U.S. Cl.
CPC ............. *G01Q 10/06* (2013.01); *G01Q 20/02* (2013.01); *G01Q 60/54* (2013.01)

(58) Field of Classification Search
CPC ......... G01Q 10/06; G01Q 20/02; G01Q 60/54
(Continued)

(56) References Cited

U.S. PATENT DOCUMENTS 10,746,759 B2 *   8/2020  Paredis ................... G01Q 10/04
2005/0062116 A1 *  3/2005  Edinger ................. G01Q 60/30
                                                    257/422
(Continued)

FOREIGN PATENT DOCUMENTS

EP        2434521 A2      3/2012
JP     2005308605 A      11/2005
(Continued)

OTHER PUBLICATIONS

PCT International Search Report and Written Opinion, Application No. PCT/EP2019/075506, dated Nov. 21, 2019, 12 pages.

*Primary Examiner* — Nicole M Ippolito
(74) *Attorney, Agent, or Firm* — McDonnell Boehnen Hulbert & Berghoff LLP

(57) ABSTRACT

Example embodiments relate to methods and apparatuses for aligning a probe for scanning probe microscopy (SPM) to the tip of a pointed sample. One embodiments includes a method for aligning an SPM probe to an apex area of a free-standing tip of a pointed sample. The method includes providing an SPM apparatus that includes the SPM probe; a sample holder; a drive mechanism; and detection, control, and representation tools for acquiring and representing an
(Continued)

image of a surface scanned by the SPM probe. The method also includes mounting the sample on the sample holder. Further, the method includes positioning the probe tip of the SPM, determining a 2-dimensional area that includes the pointed sample, performing an SPM acquisition scan, evaluating and acquired image, and placing the SPM probe in a position where it is aligned with an apex area of the free-standing tip of the pointed sample.

18 Claims, 3 Drawing Sheets

(58) Field of Classification Search
USPC .......................... 850/1, 2, 3, 4, 5, 6, 7, 8, 9
See application file for complete search history.

(56) References Cited

U.S. PATENT DOCUMENTS

2011/0068266 A1* 3/2011 Fujita ................. G01N 23/2206
250/311
2015/0338439 A1* 11/2015 Saunin ................... G01Q 60/18
850/30

FOREIGN PATENT DOCUMENTS

JP 2015175626 A 10/2015
WO 00/20823 A2 4/2000

* cited by examiner

METHOD AND APPARATUS FOR ALIGNING A PROBE FOR SCANNING PROBE MICROSCOPY TO THE TIP OF A POINTED SAMPLE

CROSS-REFERENCE TO RELATED APPLICATIONS

The present application is a national stage entry of PCT/EP2019/075506 filed Sep. 23, 2019, which claims priority to EP 18214398.2 filed on Dec. 20, 2018, the contents of each of which are hereby incorporated by reference.

FIELD OF THE DISCLOSURE

The present disclosure is related to the use of Scanning Probe Microscopy (SPM) for the imaging of the tip apex area of a pointed sample, such as a sample for Atom Probe Tomography (APT), and in particular to the problem of correctly aligning the SPM probe to the sample tip prior to the imaging process.

BACKGROUND

APT is a nano-scale 3-dimensional imaging technique in which each atom within the solid of interest that is emitted through field evaporation from a specifically fabricated tip, and that reaches a 2-dimensional position-sensitive detector, is identified. Evaporation is usually triggered by a pulsed laser directed at the tip or by a voltage pulse, while acceleration of the evaporated ions takes place under the influence of a voltage difference between the tip and the detector. Under some conditions, this technique allows to reconstruct nano-scale volumes in 3D to a sub-nanometer resolution. Applying APT to heterogeneous structures however tends to introduce severe distortions to the resulting 3D renditions. These stem primarily from APT tip shape modifications. In the standard 3D data reconstruction algorithms, the apex region of an APT tip is assumed to be, and to remain, semi-hemispherical in shape during the course of the analysis. Any change to this shape results in distortions to the 3D reconstruction of the region that is under analysis by the APT technique.

Deviations of the APT sample tip shape from the semi-hemispherical shape may be the result of differential evaporation rates occurring in heterogeneous structures. Another source of the tip deformation may be the influence of the laser pulses applied for triggering the evaporation. The laser is directed to one side of the sample, which may result in flattening of this side in the course of the APT analysis. Various ways have been suggested for determining the shape of the tip. For example, document EP2434521 is related to a laser atom probe system that includes a probe tip monitor. The monitor may be a transmission electron microscope, a scanning electron microscope, or a scanning probe microscope (SPM). The latter includes a scanning probe mounted on a cantilever. As the tip of the probe is scanned across a surface, the cantilever moves under the influence of the scanning probe's interaction with the surface. A laser-based detection system detects the cantilever movements which are then translated into an image of the surface. SPM variants include Atomic Force Microscopy (AFM), conductive AFM (c-AFM), Electric Force Microscopy (EFM) and Magnetic Force Microscopy (MFM). While the principle of using SPM for measuring the shape of a pointed sample tip is thereby not a novel idea in itself, there is a lack of a concrete methodology for effectively realizing this task. As both the sample tip and the SPM probe tip have dimensions on the nanometer scale, the correct alignment of the tips prior to the actual SPM acquisition is difficult to achieve. This problem is not limited to APT samples, but it is relevant for the alignment of an SPM probe to any pointed sample having an apex area with dimensions in the micrometer or nanometer range.

SUMMARY

The disclosure aims to provide a method and apparatus for aligning an SPM probe to a pointed sample tip, such as the tip of a sample for APT analysis. The disclosure is related to a method and apparatus as disclosed in the appended claims. The method and apparatus are suitable for aligning a probe for scanning probe microscopy (SPM) relative to the apex region of a pointed sample, such as a sample for atom probe tomography, in order to perform an SPM acquisition of the apex region to thereby obtain an image of the region. The alignment is realized by scanning an area above the sample tip while the SPM probe operates in contactless acquisition mode, and while an electric and/or a magnetic field appears around the tip of the sample. An electrostatic field may be induced by a DC bias voltage applied to the tip, a static magnetic field by a magnetic tip, and an "electric and magnetic" field is in fact an electromagnetic field induced for example by an AC bias applied to the tip, possibly on top of a DC bias. An example embodiment involves a DC biased sample scanned by a grounded probe operating in EFM mode (Electric Force Microscopy). The scan is repeated multiple times at decreasing distances from the sample tip, until the field is detected in the form of an area in the detected image exhibiting a gradient in the measured probe parameter on which the image is based. Further decreasing the distance and repeating the scan allows to define the position of the sample tip's apex area and align the probe tip to the area.

The disclosure is in particular related to a method for aligning a probe for Scanning Probe Microscopy (SPM), to the apex area of the free-standing tip of a pointed sample, comprising the steps of:

providing an SPM apparatus comprising an SPM probe mounted on a cantilever, the cantilever having a fixed end and a free end, the probe being mounted on the free end of the cantilever, the probe having a base and a tip, the apparatus further comprising a sample holder, a drive mechanism for driving a movement of the probe relative to the sample holder, and detection, control and representation tools for acquiring and representing an image of a surface scanned in two dimensions by the probe, wherein the image is based on values of a probe parameter measured during the scan, mounting the sample on the sample holder, with the sample tip pointed towards the cantilever and the probe, and wherein the sample is configured so that an electric field and/or a magnetic field appears around the tip of the sample, the field strength being highest at the tip and deteriorating radially away from the tip, positioning the SPM probe tip in a first position at a distance from the sample tip, and determining a 2-dimensional area so that the sample tip is positioned in the projection of the area along the longitudinal direction of the pointed sample, performing an SPM acquisition scan of the probe in the area, the SPM acquisition scan being performed in a contact-less SPM acquisition mode suitable for detecting the field, evaluating the acquired image, and if the field is not detected, repeating the scanning and evaluation steps at consecutive smaller distances from the sample tip, detecting the field by observing an area in the acquired image, the area exhibiting a gradient of the measured probe parameter, thereby allowing to estimate the position of the sample tip, further repeating the scanning and evaluating steps at consecutive smaller distances, each time obtaining a more accurate determination of the position of the sample tip's apex area, until the position of the apex area is determined with an accuracy that allows placing the probe in a position where the probe tip is aligned to the sample tip's apex area, placing the probe in the position, either at the end of the iterated scanning and evaluation steps, or by repositioning the probe one or more times after one or more respective scanning steps, and progressively reducing the scanning area around the sample tip position.

According to an embodiment, the pointed sample is connected to a DC voltage, the SPM probe is electrically conductive and coupled to a reference voltage, thereby creating an electric field around the sample tip, and wherein the contactless acquisition mode applied during the consecutive scans is electric force microscopy (EFM).

According to an embodiment, the cantilever and the EFM probe are subjected to an oscillation during the acquisition steps, and wherein the image is based on the measurement of the phase shift of the oscillation as the probe is scanned across a 2-dimensional area.

According to an embodiment, the pointed sample is magnetic so as to create a magnetic field around the sample tip, wherein the SPM probe is formed of a magnetic material, and wherein the contactless acquisition mode applied during the consecutive scans is magnetic force microscopy (MFM).

According to an embodiment, the method further comprises scanning the apex area of the sample tip with the SPM probe to thereby determine a 3-dimensional image of the apex area. The steps of the method may be performed at a pressure below atmospheric pressure or under vacuum.

According to an embodiment, the area exhibiting a gradient is an essentially circular area and wherein the centre of the circular area indicates the position of the sample tip.

The disclosure is also related to an SPM apparatus comprising an SPM probe mounted on a cantilever, the cantilever having a fixed end and a free end, the probe being mounted on the free end of the cantilever, the probe having a base and a tip, the apparatus further comprising a sample holder, a drive mechanism for driving a movement of the probe relative to the sample holder, and detection, control and representation tools for acquiring and representing an image of a surface scanned in two dimensions by the probe, wherein the SPM apparatus is configured to automatically perform the following steps for aligning the probe to the tip of a pointed sample mounted in the sample holder and configured so that an electric field and/or a magnetic field appears around the tip of the sample, the field strength being highest at the tip and deteriorating radially away from the tip:

performing an SPM acquisition scan of the probe in a 2-dimensional area so that the sample tip is positioned in the projection of the area along the longitudinal direction of the pointed sample, wherein the SPM acquisition scan is performed in a contact-less SPM acquisition mode suitable for detecting the field, evaluating the acquired image, and if the field is not detected, repeating the scanning and evaluation steps at consecutive smaller distances from the sample tip, detecting the field by observing an area in the acquired image, the area exhibiting a gradient of the measured probe parameter, thereby allowing to estimate the position of the sample tip, further repeating the scanning and evaluating steps at consecutive smaller distances, each time obtaining a more accurate determination of the position of the sample tip's apex area, until the position of the apex area is determined with an accuracy that allows placing the probe in a position where the probe tip is aligned to the sample tip's apex area, placing the probe in the position, either at the end of the iterated scanning and evaluation steps, or by repositioning the probe one or more times after one or more respective scanning steps, and progressively reducing the scanning area around the sample tip position.

According to an embodiment of the apparatus, the probe is electrically conductive and the apparatus is configured to apply electric force microscopy (EFM) as the contactless SPM acquisition mode for aligning the probe to the sample when the sample is electrically biased so that the electromagnetic field appearing around the sample tip is an electric field.

According to another embodiment of the apparatus, the probe is magnetic and the apparatus is configured to apply magnetic force microscopy (MFM) as the contactless SPM acquisition mode for aligning the probe to the sample when the sample is magnetic so that the electromagnetic field appearing around the sample tip is a magnetic field.

According to an embodiment, the apparatus is configured to automatically reduce the step height between consecutive scanning steps as the accuracy with which the sample tip's apex area is determined, increases.

DETAILED DESCRIPTION

According to the disclosure, the positioning of an SPM probe tip relative to the apex area of a sample tip is realized by creating an electric and/or a magnetic field around the sample tip, and by scanning the region above the tip with the SPM probe in contactless detection mode. The measurement of the interaction between the probe and the field enables the alignment of the probe to the sample tip. The aligned probe position can serve as the guiding point to perform scans across the apex area of the sample tip to produce a topographical image of the sample tip area.

Figure 1:
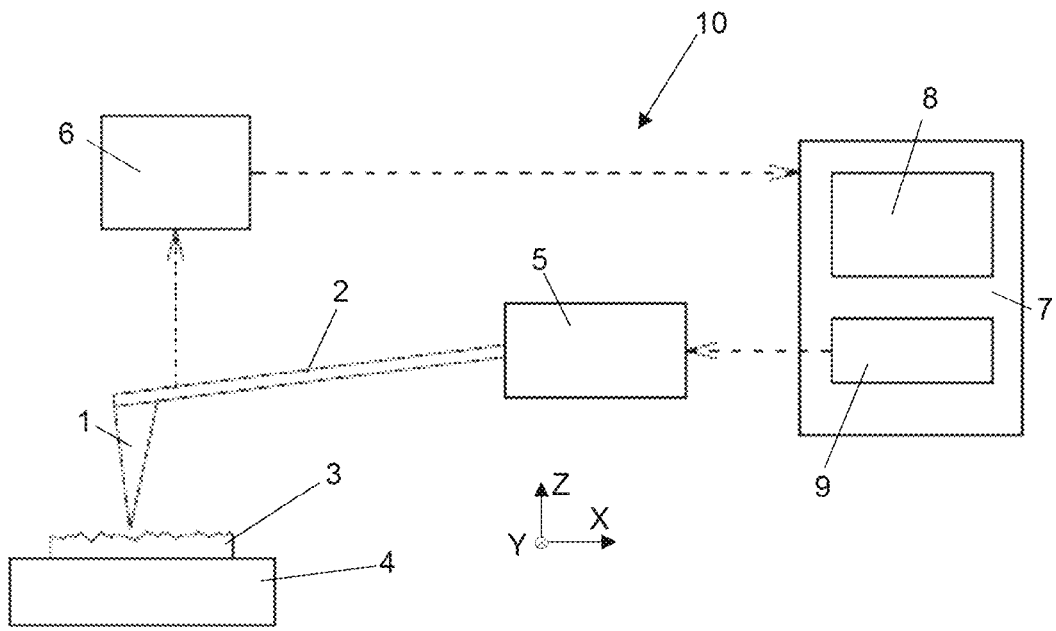
FIG. 1 illustrates an SPM apparatus.

FIG. 1 illustrates an SPM apparatus 10 known as such in the art, and suitable for performing the method of the disclosure. Prior to describing the method of the disclosure, the components of the apparatus and the use of the apparatus for imaging the topography of a sample is briefly recapitulated. The probe 1 is a solid body with a sharp tip, for example a pyramid shaped element, attached to the free end of a cantilever 2. For the purpose of the alignment described herein, and based on an electric field appearing around the sample tip, the material of the probe may be electrically conductive. Any known conductive probe type can be used, such as an AFM probe made of silicon or silicon carbide. Diamond probes or metal-coated probes are also known.

A sample 3 is mounted on a sample holder 4. The fixed end of the cantilever 2 is coupled to an XYZ drive mechanism 5, for driving movements in the orthogonal directions X, Y and Z indicated in the drawing. Alternatively, the cantilever 2 is stationary and the drive mechanism is coupled to the sample holder 4, or both the cantilever 2 and the sample holder 4 could be coupled to their own drive mechanisms. The drive mechanism 5 is capable of imposing a scanning movement on the probe 1 relative to the sample 3, in the X-Y plane, and to control the distance in the Z-direction between the sample 3 and the probe 1. Movements of the cantilever in the Z-direction are detected by a detector 6. The detector usually includes a laser and a mirror positioned to capture the laser beam reflected off the back of the cantilever 2. As the X-Y scan is performed, a signal that corresponds to the reflected beam is translated by a computer 7 into a data set that is representative of the sample's topography, composition or other characteristics, which may then be stored in a memory and represented as an image on a suitable output, as a computer screen 8. The computer 7 comprises a controller 9 configured to send control signals to the drive mechanism 5.

SPM probes may operate in a variety of operational modes known as such in the art. For example, an AFM probe may operate in contact mode, wherein the probe 1 is continuously in physical contact with the scanned surface. In some embodiments, a feedback loop maintains a constant force between the sample and the probe. Another operational mode is known as intermittent contact mode, wherein the probe is subjected to a controlled oscillation in the Z-direction at or near the cantilever's resonance frequency, for example by a piezo-electric transducer coupled to the cantilever, and wherein the topology of the sample is detected by changes in the oscillation, generated by the interaction between the probe and the surface. The interaction may be based on the direct contact forces and/or on non-contact forces such as Van der Waals forces. Electrostatic Force Microscopy (EFM) is a form of SPM wherein the probe operates in non-contact mode, and which may be used to map distributions of electric charge in a sample. The probe may again be subjected to a controlled oscillation in the Z-direction at or near the cantilever's resonance frequency. The interaction between the oscillating probe and the electric field generated by the charges is detected in the form of a phase shift of the oscillating probe relative to the driving oscillation. The absolute value of the phase shift is directly related to the field strength. Magnetic Force Microscopy (MFM) is a similar method, wherein a magnetic probe is used to detect magnetic fields in the vicinity of a sample. Other non-contact SPM variants are known, such as Kelvin Probe Force Microscopy (KPFM), wherein an AC bias is applied to the probe on top of the DC bias and wherein the probe is not subjected to a mechanical oscillation, but wherein the oscillation is caused by the AC component of the bias voltage. SPM modes like EFM and MFM may operate in oscillating mode, but they can be operated also in static mode. In the latter case the phase shift parameter is replaced by another parameter derivable from the interaction between the static probe and the field.

Figure 2:
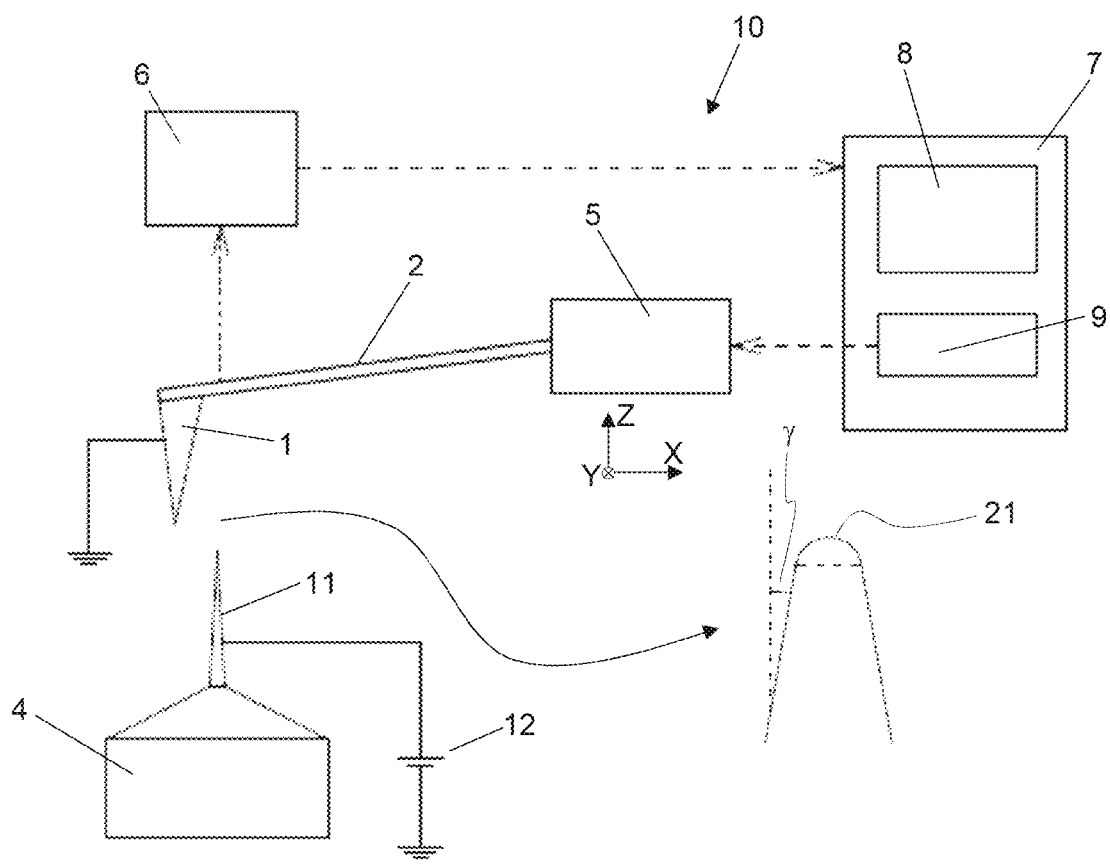
FIG. 2 shows the apparatus in a configuration including an APT sample, according to example embodiments. A detailed sub-portion of the drawing shows a geometry of a needle-shaped sample tip.

Any known contactless SPM mode can be used in example embodiments. Example embodiments will however be described on the basis of an embodiment wherein EFM is used for aligning the probe to the sample. The skilled person who is familiar with SPM will understand from this description how the other contactless modes may be applied for the purpose of bringing embodiments into practice. FIG. 2 illustrates the above-described SPM apparatus 10 in a measurement configuration according to the EFM-based embodiment. The electrically conductive probe 1 is positioned in the vicinity of the tip of an APT sample 11, mounted on the sample holder 4. In some embodiments, the sample is oriented vertically with the tip pointing upwards, as shown in the drawing, but this is not a requirement. The terms "above," "horizontal," and "vertical" used hereafter refer to this vertical configuration. An APT sample that has not undergone evaporation has an apex region of semi-hemispherical shape with a tip diameter of about 30-50 nm depending on the shank angle $\gamma$ of the sample (see detail in FIG. 2). The SPM probe tip diameter is typically in the order of 20 nm or less. During an APT experiment, as the evaporation progresses, the diameter of the apex area 21 may become considerably larger. This can be up to 200 nm or more (and the shape may deviate from a geometrically defined semi-hemisphere due to distortions of the tip as described in the introduction). At various stages during an APT analysis, a 2-dimensional X-Y scan of the SPM probe tip along the surface of the apex region of the sample tip is therefore capable of detecting the shape of the apex region according to a known SPM technique. The difficulty is the positioning of the probe 1 relative to the sample tip for conducting a correct scan.

For the purpose of aligning the probe 1 to the sample 11 in accordance with the first embodiment, the sample 11 is electrically biased, i.e. it is connected to a DC voltage source 12, so as to create an electric field around the apex area of the sample tip. The probe 1 is grounded, so that the DC voltage appears as the voltage difference between the sample 11 and the probe 1. The characteristics of the electric field appearing around the apex region of a biased APT sample are well known from the APT technology itself: during APT testing, the sample is equally biased relative to a grounded counter-electrode. The counter electrode is however placed at a larger distance from the sample compared to the SPM probe tip 1 applied in an example method. The electric field around the sample tip during APT testing is known to be strong, in the order of a few tens of V/nm, due to the small radius of the tip's apex area and the magnitude of the applied bias. The field strength furthermore decreases rapidly in the radial direction moving away from the sample tip. Any possible disturbance caused by the presence of the SPM tip at radial distances in the order of nanometers to micrometers does not impede the alignment process according to some embodiments.

An example method realizes the localization of the sample tip by scanning the probe in an area above the sample tip. The probe is first brought into a starting position in the vicinity of the sample tip by a rough positioning step, performed for example with the help of the optical microscope built into most SPM tools. In the starting position, the probe tip is above the sample tip and at a horizontal distance from the sample tip in the order of micrometers. The alignment process can now begin. In contactless EFM mode, the probe 1 (oscillating at or near its resonance frequency) is scanned across a predefined horizontal area whose vertical projection is certain to comprise the position of the sample tip. This may for example be an area of 50 by 50 micrometers around the starting position of the probe. The scan takes place at a fixed vertical position (i.e. a fixed Z-coordinate) above the sample tip, at a distance from the sample tip in the order of micrometers, for example about 50-100 micrometers. The image acquired by the scan is then evaluated. The image is formed by mapping the measured phase shift values on the two-dimensional scanned area, with the help of a color scale or grey scale.

Figure 3A:
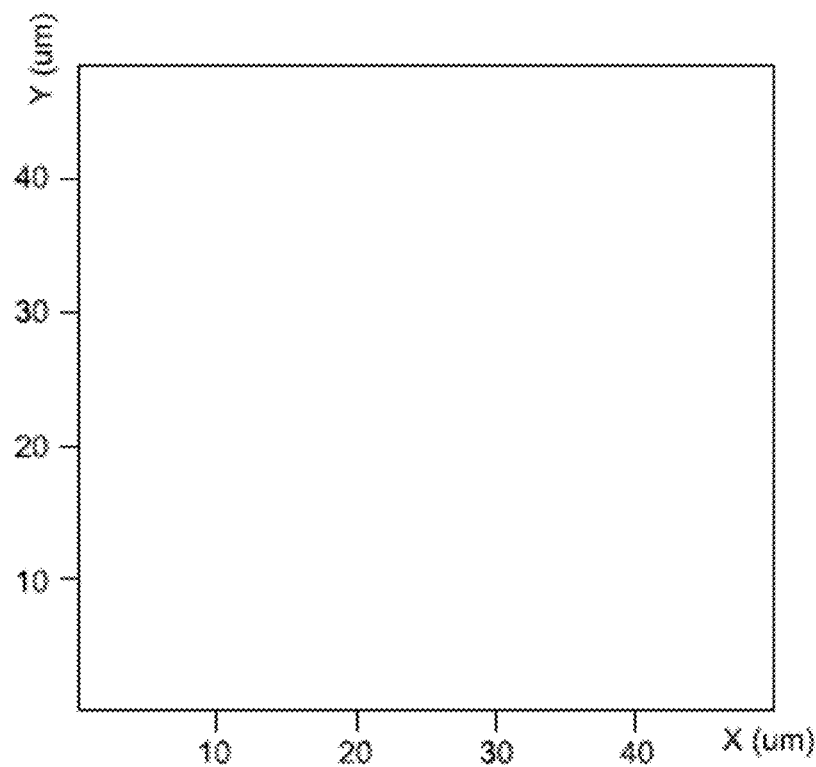
FIG. 3A shows a conceptual representation of an SPM image acquired in the course of performing a method prior to the detection of the sample tip, according to example embodiments.
Figure 3B:
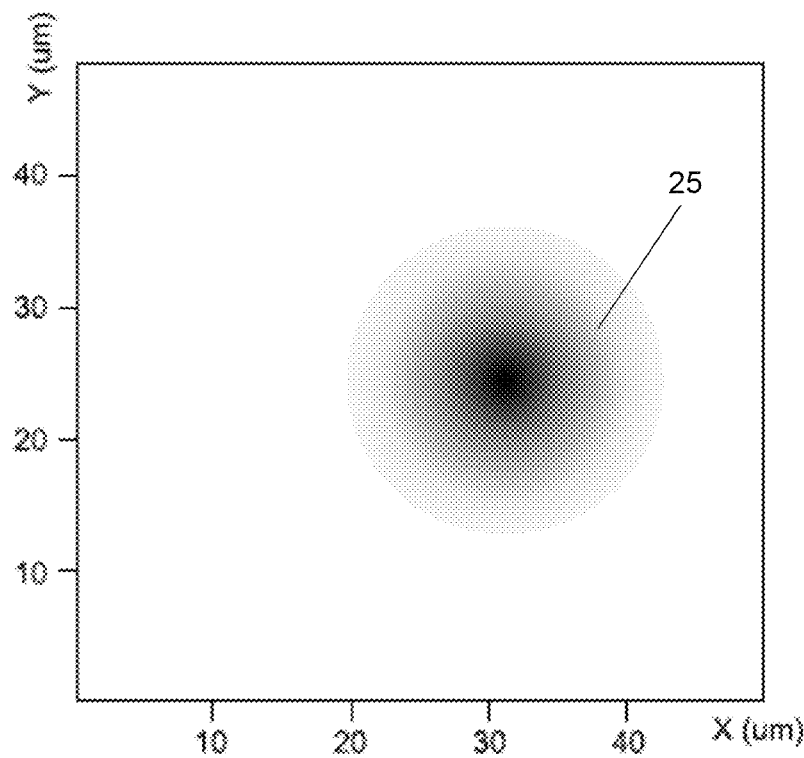
FIG. 3B shows a conceptual representation of an SPM image acquired in the course of performing a method after the detection of the sample tip, according to example embodiments.
Figure 3C:
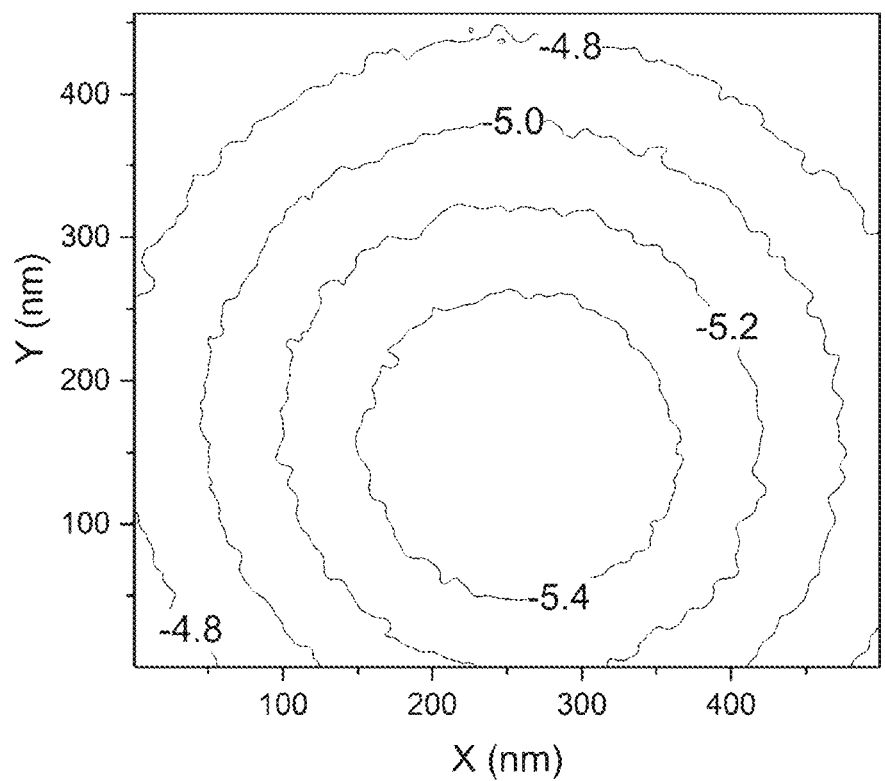
FIG. 3C shows a line diagram derived from an actual measured EFM image acquired by the method, according to example embodiments.

When the probe is too far from the sample tip, the field is not detected, yielding a blank image of the measured phase, as illustrated in FIG. 3A. The EFM scan is then repeated at consecutive levels, approaching the sample tip in a stepwise manner, for example using an initial fixed step of 2 micrometers between consecutive levels. When the probe is close enough to detect the electric field, the image shows an area 25 with higher values of the phase shift at the center of the area, as illustrated in FIG. 3B, wherein the darker color is related to higher phase shift values. In other words, the area 25 exhibits a gradient of the measured probe parameter, in this case the phase shift. The radially decreasing phase is related to the radially decaying electric field around the sample tip and due equally to the fact that this field is essentially not disturbed by the presence of the probe. The precise shape of the detected area 25 may depend on the details of the scanning pattern used to obtain the image. In some embodiments, a scanning pattern is applied that results in an approximately circular detected area. Regardless of the shape of the area, the measured gradient of the phase shift within the area allows to determine a point or a region within the area where the phase shift is highest, and which indicates the position of the sample tip. In the case of a circular area 25 illustrated in FIG. 3B, this point or region is situated at the center of the circular area. At first, the detected area reveals a small phase shift gradient across the area due to the relatively large distance from the tip. As the distance decreases for the subsequent scans, the phase shift changes more sharply from higher values at the center of the circular area to lower values at the edge. The step height between consecutive levels preferably may decrease as the probe approaches the sample tip. During the approach, the scanning area is preferably may be reduced and centered around the detected sample tip position, i.e. zooming in on that position, and measuring the phase shift with an increasing spatial resolution across the 2-dimensional scanned area. In the end, the method allows to determine a position at which the probe is aligned to the sample tip. FIG. 3c shows a measured image. The probe used for obtaining this image was a PointProbe® Plus EFM probe from Nanoworld AG. The applied DC bias voltage was 10V. The APT sample tip diameter was about 100 nm. The measurement was performed in air. The numbers indicated on the circular curves correspond to the measured phase shift (in degrees). The diameter of the inner circle is about 200 nm which is sufficiently close to the expected dimensions of the sample tip's apex area. When the probe tip is positioned as close as possible to the center of the inner circle, the probe tip will effectively face the apex area of the sample tip, i.e. the probe will be aligned to the sample tip. From this aligned position, an imaging scan of the sample tip can be initiated. The SPM tool may apply another SPM mode, such as AFM or intermittent AFM, for performing the actual imaging of the sample tip. The image may then be based on other probe parameters than the phase shift, but the method as such is the same as described above.

In order to maximize the absolute value of the phase shift values, which enables detection of the field at larger distances, as well as enabling a more accurate determination of the sample tip position, a number of parameters may be tuned. The higher the bias voltage imposed by the DC source 12, the higher the phase shift. Likewise, the lower the spring constant of the cantilever/probe tip assembly, the higher the phase shift. Finally, the lower the damping of the cantilever/probe tip assembly, the higher the phase shift. According to an embodiment, the method is performed at low ambient pressure or under vacuum, which reduces the damping compared to performing the method under atmospheric pressure conditions.

According to another embodiment, magnetic force microscopy is used instead of EFM. This embodiment is suitable only when the sample tip itself is magnetic, so that a magnetic field is created around the tip. This field has similar characteristics as the electric field described above and can therefore be detected by the same procedure described in relation to the first embodiment, but effected with an SPM apparatus suitable for MFM, i.e. utilizing a probe tip formed of a magnetic material.

In general terms, example methods rely on the appearance of an electric and/or a magnetic field around a sharp tip, the field strength decreasing radially around the tip, and the detection of the field by an SPM apparatus operating in a non-contact mode configured to detect the presence of the field. The method may also be used to obtain a 3D model of the electromagnetic field as such, based on the data obtained during the consecutive scans.

As stated above, the scans may be performed in progressively smaller areas around the tip, each time centered around the center of a previously detected graded area. This reduction of the scanned area may be applied after every iteration step, or each time after one or more iteration steps, based on the increased accuracy with which the sample tip position is determined. At the end of the process, the probe thereby automatically arrives at a position wherein it is aligned to the sample tip. It is also possible to apply the same scanning area during the whole of the alignment method or during a given number of iterations at the end of the method, for example if the initial scanning area is already small compared to the sample tip, or if the SPM resolution allows the determination of the sample tip with high accuracy within a large viewing frame. The probe may then be positioned at the aligned position after the position has been determined by the iterative steps.

Embodiments described herein are not only applicable to APT samples, but are also applicable to any pointed sample, i.e. also to samples having an apex region with larger dimensions than APT samples. However, the sample tip dimensions are within a range to which SPM methods are practically applicable.

The steps of the method may be performed in a fully standard SPM apparatus used in any suitable non-contact SPM mode, wherein the various steps of (re)positioning the probe, stepwise decreasing the Z-position of the probe relative to the sample, stopping and re-starting the probe movements in X and Y directions are controlled manually by an operator. The method may also be performed automatically in an SPM apparatus provided with a suitable control tool for performing the method steps automatically. The disclosure is equally related to such an apparatus. The control tool may be a software-operated controller programmed to execute the steps of the method automatically, until reaching a suitable starting position of the probe relative to the sample tip's apex region for the actual SPM scan of the sample tip. The control tool is thus configured to execute the following actions:

Positioning the SPM probe at the starting position. Optionally this step is not performed automatically, but manually by the operator, for example based on an image obtained with a microscope, Performing consecutive SPM acquisition scans, each time evaluating the obtained image, and each time lowering the distance between the probe and the sample, At each acquisition step, detecting an area in the image exhibiting a gradient of the measured probe parameter, indicating the position of the sample, Continuing the consecutive scans, until the obtained image allows the determination of the position of the sample tip's apex area Positioning the SPM probe so that the probe tip faces the sample tip's apex area.

In some embodiments the control tool is further configured to automatically reduce the step height between subsequent scans as a function of the degree of accuracy with which the sample tip position is determined. The tool may furthermore be programmed to automatically reduce the scanning area as a function of aid the degree of accuracy, so that the probe automatically arrives in the aligned position at the end of the sequence of method steps.

While example embodiments have been illustrated and described in detail in the drawings and foregoing description, such illustration and description are to be considered illustrative and not restrictive. Other variations to the disclosed embodiments can be understood and effected by those skilled in the art in practicing example embodiments, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method for aligning a probe for Scanning Probe Microscopy (SPM) to an apex area of a free-standing tip of a pointed sample, comprising:

providing an SPM apparatus comprising:
an SPM probe mounted on a cantilever, wherein the cantilever comprises a fixed end and a free end, wherein the SPM probe is mounted on the free end of the cantilever, and wherein the SPM probe has a base and a tip;
a sample holder;
a drive mechanism for driving a movement of the SPM probe relative to the sample holder; and
detection, control, and representation tools for acquiring and representing an image of a surface scanned in two dimensions by the SPM probe, wherein the image is based on values of a SPM probe parameter measured during the scan;

mounting the sample on the sample holder with the free-standing tip of the pointed sample pointed towards the cantilever and the SPM probe, wherein the pointed sample is configured so that an electric field or a magnetic field appears around the free-standing tip of the pointed sample, and wherein a field strength is highest at the free-standing tip and deteriorates radially away from the free-standing tip;

positioning a probe tip of the SPM in a first position at a distance from the free-standing tip of the pointed sample;

determining a 2-dimensional area so that the free-standing tip of the pointed sample is positioned in the projection of the 2-dimensional area along a longitudinal direction of the pointed sample;

performing an SPM acquisition scan of the SPM probe in the 2-dimensional area, wherein the SPM acquisition scan is performed in a contactless SPM acquisition mode suitable for detecting the field;

evaluating the acquired image;

if the field is not detected, repeating the scanning and evaluation steps at consecutive smaller distances from the free-standing tip of the pointed sample;

detecting the field by observing an area in the acquired image, wherein the area in the acquired image exhibits a gradient of the measured SPM probe parameter, thereby allowing an estimation of a position of the free-standing tip of the pointed sample;

further repeating the scanning and evaluating steps at consecutive smaller distances, each time obtaining a more accurate determination of a position of the apex area of the free-standing tip of the pointed sample, until the position of the apex area is determined with an accuracy that allows placing the SPM probe in a position where the probe tip of the SPM is aligned to the apex area of the free-standing tip of the pointed sample; and placing the SPM probe in the position where the probe tip of the SPM is aligned to the apex area of the free-standing tip of the pointed sample, either:
at the end of the repeated scanning and evaluation steps; or
by repositioning the SPM probe one or more times after one or more respective scanning steps and progressively reducing a scanning area around a position of the free-standing tip of the pointed sample.

2. The method according to claim 1, wherein the pointed sample is connected to a DC voltage, wherein the SPM probe is electrically conductive and coupled to a reference voltage, thereby creating an electric field around the free-standing tip of the pointed sample, and wherein the contactless SPM acquisition mode applied during the repeated scanning steps is electric force microscopy (EFM).

3. The method according to claim 2, wherein the cantilever and the SPM probe are subjected to an oscillation during the repeated scanning steps, and wherein the image is based on the measurement of a phase shift of the oscillation as the SPM probe is scanned across a 2-dimensional area.

4. The method according to claim 1, wherein the pointed sample is magnetic so as to create a magnetic field around the free-standing tip of the pointed sample tip, wherein the SPM probe is formed of a magnetic material, and wherein the contactless SPM acquisition mode applied during the repeated scanning steps is magnetic force microscopy (MFM).

5. The method according to claim 1, wherein the method further comprises scanning the apex area of the free-standing tip of the pointed sample with the SPM probe to thereby determine a 3-dimensional image of the apex area.

6. The method according to claim 1, wherein the steps of the method are performed at a pressure below atmospheric pressure or under vacuum.

7. The method according to claim 1, wherein the area in the acquired image exhibiting a gradient is an essentially circular area, and wherein a center of the essentially circular area indicates the position of the free-standing tip of the pointed sample.

8. An SPM apparatus comprising:
an SPM probe mounted on a cantilever, wherein the cantilever has a fixed end and a free end, wherein the SPM probe is mounted on the free end of the cantilever, and wherein the SPM probe has a base and a tip;
a sample holder;
a drive mechanism for driving a movement of the SPM probe relative to the sample holder; and
detection, control, and representation tools for acquiring and representing an image of a surface scanned in two dimensions by the SPM probe, wherein the SPM apparatus is configured to automatically perform the following steps for aligning the SPM probe to a tip of a pointed sample mounted in the sample holder and configured so that an electric field or a magnetic field appears around the tip of the pointed sample with a field strength being highest at the tip of the pointed sample and deteriorating radially away from the tip of the pointed sample:
performing an SPM acquisition scan of the SPM probe in a 2-dimensional area so that the tip of the pointed sample is positioned in the projection of the 2-dimensional area along a longitudinal direction of the pointed sample, wherein the SPM acquisition scan is performed in a contactless SPM acquisition mode suitable for detecting the field;
evaluating the acquired image;
if the field is not detected, repeating the scanning and evaluation steps at consecutive smaller distances from the tip of the pointed sample;
detecting the field by observing an area in the acquired image, wherein the area in the acquired image exhibits a gradient of a measured SPM probe parameter, thereby allowing an estimation of a position of the tip of the pointed sample;
further repeating the scanning and evaluating steps at consecutive smaller distances, each time obtaining a more accurate determination of a position of an apex area of the tip of the pointed sample, until the position of the apex area of the tip of the pointed sample is determined with an accuracy that allows placing the SPM probe in a position where a probe tip of the SPM probe is aligned to the apex area of the tip of the pointed sample; and
placing the SPM probe in the position where the probe tip of the SPM probe is aligned to the apex area of the tip of the pointed sample, either:
at the end of the repeated scanning and evaluation steps; or
by repositioning the SPM probe one or more times after one or more respective scanning steps and progressively reducing a scanning area around the position of the tip of the pointed sample.

9. The apparatus according to claim 8, wherein the SPM probe is electrically conductive, and wherein the apparatus is configured to apply electric force microscopy (EFM) as the contactless SPM acquisition mode for aligning the SPM probe to the sample when the sample is electrically biased so that an electromagnetic field appearing around the tip of the pointed sample is an electric field.

10. The apparatus according to claim 8, wherein the SPM probe is magnetic, and wherein the apparatus is configured to apply magnetic force microscopy (MFM) as the contactless SPM acquisition mode for aligning the SPM probe to the sample when the sample is magnetic so that an electromagnetic field appearing around the tip of the pointed sample is a magnetic field.

11. The apparatus according to claim 8, wherein the apparatus is configured to automatically reduce a step height between consecutive scanning steps as the accuracy with which the apex area of the tip of the pointed sample is determined, increases.

12. A Scanning Probe Microscopy (SPM) probe aligned to an apex area of a free-standing tip of a pointed sample, wherein the SPM probe is aligned using a method comprising:
providing an SPM apparatus comprising:
the SPM probe mounted on a cantilever, wherein the cantilever comprises a fixed end and a free end, wherein the SPM probe is mounted on the free end of the cantilever, and wherein the SPM probe has a base and a tip;
a sample holder;
a drive mechanism for driving a movement of the SPM probe relative to the sample holder; and
detection, control, and representation tools for acquiring and representing an image of a surface scanned in two dimensions by the SPM probe, wherein the image is based on values of a SPM probe parameter measured during the scan;
mounting the sample on the sample holder with the free-standing tip of the pointed sample pointed towards the cantilever and the SPM probe, wherein the pointed sample is configured so that an electric field or a magnetic field appears around the free-standing tip of the pointed sample, and wherein a field strength is highest at the free-standing tip and deteriorates radially away from the free-standing tip;
positioning a probe tip of the SPM in a first position at a distance from the free-standing tip of the pointed sample;
determining a 2-dimensional area so that the free-standing tip of the pointed sample is positioned in the projection of the 2-dimensional area along a longitudinal direction of the pointed sample;
performing an SPM acquisition scan of the SPM probe in the 2-dimensional area, wherein the SPM acquisition scan is performed in a contactless SPM acquisition mode suitable for detecting the field;
evaluating the acquired image;
if the field is not detected, repeating the scanning and evaluation steps at consecutive smaller distances from the free-standing tip of the pointed sample;
detecting the field by observing an area in the acquired image, wherein the area in the acquired image exhibits a gradient of the measured SPM probe parameter, thereby allowing an estimation of a position of the free-standing tip of the pointed sample;
further repeating the scanning and evaluating steps at consecutive smaller distances, each time obtaining a more accurate determination of a position of the apex area of the free-standing tip of the pointed sample, until the position of the apex area is determined with an accuracy that allows placing the SPM probe in a position where the probe tip of the SPM is aligned to the apex area of the free-standing tip of the pointed sample; and placing the SPM probe in the position where the probe tip of the SPM is aligned to the apex area of the free-standing tip of the pointed sample, either:
  at the end of the repeated scanning and evaluation steps; or
  by repositioning the SPM probe one or more times after one or more respective scanning steps and progressively reducing a scanning area around a position of the free-standing tip of the pointed sample.

13. The SPM probe according to claim 12, wherein the pointed sample is connected to a DC voltage, wherein the SPM probe is electrically conductive and coupled to a reference voltage, thereby creating an electric field around the free-standing tip of the pointed sample, and wherein the contactless SPM acquisition mode applied during the repeated scanning steps is electric force microscopy (EFM).

14. The SPM probe according to claim 13, wherein the cantilever and the SPM probe are subjected to an oscillation during the repeated scanning steps, and wherein the image is based on the measurement of a phase shift of the oscillation as the SPM probe is scanned across a 2-dimensional area.

15. The SPM probe according to claim 12, wherein the pointed sample is magnetic so as to create a magnetic field around the free-standing tip of the pointed sample, wherein the SPM probe is formed of a magnetic material, and wherein the contactless SPM acquisition mode applied during the repeated scanning steps is magnetic force microscopy (MFM).

16. The SPM probe according to claim 12, wherein the method further comprises scanning the apex area of the free-standing tip of the pointed sample with the SPM probe to thereby determine a 3-dimensional image of the apex area.

17. The SPM probe according to claim 12, wherein the steps of the method are performed at a pressure below atmospheric pressure or under vacuum.

18. The SPM probe according to claim 12, wherein the area in the acquired image exhibiting a gradient is an essentially circular area, and wherein a center of the essentially circular area indicates the position of the free-standing tip of the pointed sample.

* * * * *